United States Patent
Tan et al.

(10) Patent No.: US 8,642,986 B2
(45) Date of Patent: Feb. 4, 2014

(54) INTEGRATED CIRCUIT HAVING MICROELECTROMECHANICAL SYSTEM DEVICE AND METHOD OF FABRICATING THE SAME

(75) Inventors: Tzung-Han Tan, Taipei (TW); Bang-Chiang Lan, Taipei (TW); Ming-I Wang, Taipei (TW); Tzung-I Su, Yunlin County (TW); Chien-Hsin Huang, Taichung (TW); Hui-Min Wu, Hsinchu County (TW); Chao-An Su, Kaohsiung County (TW); Min Chen, Taipei County (TW); Meng-Jia Lin, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 595 days.

(21) Appl. No.: 12/565,154

(22) Filed: Sep. 23, 2009

(65) Prior Publication Data

US 2011/0068374 A1    Mar. 24, 2011

(51) Int. Cl.
*H01L 29/84*    (2006.01)
*H01L 21/30*    (2006.01)

(52) U.S. Cl.
USPC ... 257/2; 257/115; 257/E21.211; 257/E29.324; 257/254; 257/503; 438/53; 438/50; 438/454

(58) Field of Classification Search
USPC ............ 257/2, 415, E21.211, E29.324, 254; 438/50, 53, 454
See application file for complete search history.

(56) References Cited

U.S. PATENT DOCUMENTS

| | | | |
|---|---|---|---|
| 2006/0105543 A1* | 5/2006 | Xiao et al. | 438/459 |
| 2007/0284682 A1 | 12/2007 | Laming et al. | |
| 2009/0273043 A1* | 11/2009 | Lee et al. | 257/416 |

* cited by examiner

*Primary Examiner* — Cathy N Lam
(74) *Attorney, Agent, or Firm* — Ding Yu Tan

(57) ABSTRACT

An integrated circuit (IC) having a microelectromechanical system (MEMS) device buried therein is provided. The integrated circuit includes a substrate, a metal-oxide semiconductor (MOS) device, a metal interconnect, and the MEMS device. The substrate has a logic circuit region and a MEMS region. The MOS device is located on the logic circuit region of the substrate. The metal interconnect, formed by a plurality of levels of wires and a plurality of vias, is located above the substrate to connect the MOS device. The MEMS device is located on the MEMS region, and includes a sandwich membrane located between any two neighboring levels of wires in the metal interconnect and connected to the metal interconnect.

8 Claims, 5 Drawing Sheets

INTEGRATED CIRCUIT HAVING MICROELECTROMECHANICAL SYSTEM DEVICE AND METHOD OF FABRICATING THE SAME

BACKGROUND OF THE INVENTION

1. Field of the Invention

The present invention generally relates to an integrated circuit (IC) and a method of fabricating the same, in particular, to an IC in which a microelectromechanical system (MEMS) device is integrated with a semiconductor device and a method of fabricating the same.

2. Description of Related Art

A microelectromechanical system (MEMS) device is a microelectromechanical device fabricated by using a microprocessing technique. Duo to its advantages in light weight and small size, the MEMS device well satisfies the current requirements for light, thin, short, and small electronic products, and is studied in many fields. The existing MEMS devices include accelerometers, switches, capacitors, sensors, microphones, and other ultra small-sized electromechanical devices.

MEMS microphones fabricated by using the MEMS technology are advantageous in having a light weight, small size, and desirable signal quality, and become the mainstream of miniature microphones.

The miniature microphones are widely applied in electronic produces such as mobile phones, and due to increasing demands on the receiving quality, miniaturization, and circuit integration of the microphone, the MEMS microphone is further highlighted.

SUMMARY OF THE INVENTION

Accordingly, the present invention is directed to an integrated circuit (IC), in which a microelectromechanical system (MEMS) device and a semiconductor device are formed on the same substrate.

The present invention is also directed to a process of fabricating an IC, in which the fabrication of a MEMS device is integrated with that of a semiconductor device, thereby simplifying the process.

The present invention provides an IC, which includes a substrate, a metal-oxide semiconductor (MOS) device, a metal interconnect, and a MEMS device. The substrate includes a logic circuit region and a MEMS region. The MOS device is located on the logic circuit region of the substrate. The metal interconnect, formed by a plurality of levels of wires and a plurality of vias, is located above the substrate to connect the MOS device. The MEMS device is located on the MEMS region, and includes a sandwich membrane serving as an electrode located between any two neighboring levels of wires in the metal interconnect and connected to the metal interconnect.

In an embodiment of the present invention, the sandwich membrane includes a first insulating layer, a second insulating layer, and a conductive layer located between the first insulating layer and the second insulating layer.

In an embodiment of the present invention, a material of the first insulating layer and the second insulating layer is different from that of a dielectric layer in the metal interconnect.

In an embodiment of the present invention, the material of the first insulating layer and the second insulating layer includes silicon nitride or silicon oxynitride.

In an embodiment of the present invention, the IC further includes a protection wall surrounding the MEMS region.

In an embodiment of the present invention, the IC further includes another electrode located in the substrate.

The present invention further provides a method of fabricating an IC, which includes the following steps. First, a substrate including a logic circuit region and a MEMS region is provided. Then, a MOS device is formed on the logic circuit region of the substrate. A metal interconnect constituted by a plurality of levels of wires and a plurality of vias is formed above the substrate to connect the MOS device. Afterward, a sandwich membrane of a MEMS device is formed on the MEMS region. The sandwich membrane serving as an electrode is located between any two neighboring levels of wires in the metal interconnect and is connected to the metal interconnect.

In an embodiment of the present invention, the method of fabricating an IC includes forming a doped region in the substrate on the MEMS region to serve as another electrode.

In an embodiment of the present invention, the method of fabricating an IC includes forming a dielectric layer on the logic circuit region and the MEMS region of the substrate, then forming the metal interconnect in the dielectric layer, and forming the sandwich membrane of the MEMS device in the dielectric layer between any two neighboring levels of wires in the metal interconnect.

In an embodiment of the present invention, the method of fabricating an IC further includes forming a protection wall in the dielectric layer surrounding the MEMS region of the substrate, removing a part of the substrate from a bottom side of the substrate and forming an air cavity in the MEMS region, then removing a part of the substrate of the doped region to form a plurality of openings to expose the dielectric layer, and removing the dielectric layer in the protection wall from the MEMS region.

In an embodiment of the present invention, the step of forming the sandwich membrane includes forming a first insulating layer and a second insulating layer in the dielectric layer, and forming a conductive layer between the first insulating layer and the second insulating layer.

In an embodiment of the present invention, a material of the first insulating layer and the second insulating layer is different from that of a dielectric layer in the metal interconnect.

In an embodiment of the present invention, the material of the first insulating layer and the second insulating layer includes silicon nitride or silicon oxynitride.

The present invention further provides a method of fabricating an IC, which includes the following steps. First, a front end process is performed to form a semiconductor device on a substrate. After the front end process, a back end process is performed to form a metal interconnect and a sandwich membrane of a MEMS device on the substrate. The sandwich membrane serves as an electrode, and the metal interconnect connects the semiconductor device to the sandwich membrane.

In an embodiment of the present invention, the sandwich membrane is formed during the fabrication of the metal interconnect.

In an embodiment of the present invention, the method of fabricating an IC further includes forming another electrode in the substrate during the front end process.

In an embodiment of the present invention, the method of fabricating an IC further includes forming a protection wall surrounding the sandwich membrane during the fabrication of the metal interconnect.

In an embodiment of the present invention, the sandwich membrane is formed before the substrate is die-cut.

In an embodiment of the present invention, the sandwich membrane is formed before the substrate is packaged.

In the present invention, the fabrication of the MEMS device is integrated with that of the semiconductor device, for example, a complementary metal-oxide semiconductor (CMOS). Particularly, the sandwich membrane of the MEMS device is buried in the dielectric layer, and the fabrication of the sandwich membrane is integrated with the back end process of forming the metal interconnect during the fabrication of the semiconductor device, thereby simplifying the process of fabricating an IC.

In order to make the aforementioned and other objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
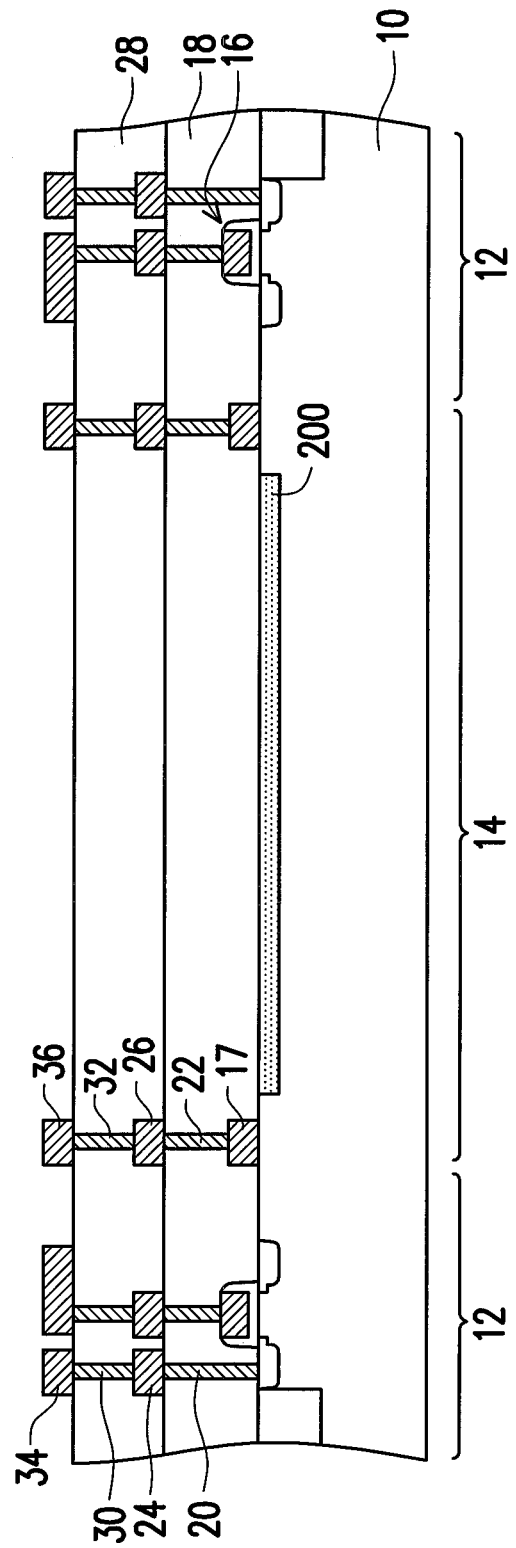
FIGS. 1A to 1E are schematic cross-sectional views illustrating a process of a method of fabricating an IC according to embodiments of the present invention, in which a MEMS device is integrated with a semiconductor device.

Reference will now be made in detail to the present embodiments of the invention, examples of which are illustrated in the accompanying drawings. Wherever possible, the same reference numbers are used in the drawings and the description to refer to the same or like parts.

FIGS. 1A to 1E are schematic cross-sectional views illustrating a process of a method of fabricating an IC according to embodiments of the present invention, in which a MEMS device is integrated with a semiconductor device.

Referring to FIG. 1A, a substrate 10 including a region 12 and a region 14 is provided. In an embodiment, the region 12 is a logic circuit region 12, and the region 14 is a MEMS region 14, which are taken as an example for illustration below. A material of the substrate 10 is, for example, a semiconductor, such as silicon or silicon germanium. First, a front end process is performed to form a MOS device 16 on the logic circuit region 12 of the substrate 10, and form a doped region 200 and a protection ring 17 on the MEMS region 14. The MOS device 16 is, for example, an N-channel MOS device, a P-channel MOS device, or a CMOS device. The doped region 200 serves as an electrode of the MEMS device, for example, a microphone. The protection ring 17 surrounds the MEMS region 14, for separating the logic circuit region 12 from the MEMS region 14.

Next, a back end process is performed to form a dielectric layer 18 on the substrate 10. Then, vias (or referred to as a contact holes) 20 and a protection plug 22 are formed in the dielectric layer 18 on the logic circuit region 12 and the MEMS region 14. The vias 20 longitudinally connects the MOS device 16. The protection ring 17 surrounds the MEMS region 14. The vias 20 and the protection plug 22 are formed by, for example, respectively forming a longitudinal via openings and annular trench in the dielectric layer 18 on the logic circuit region 12 and the MEMS region 14, disposing a conductive material on the dielectric layer 18 and filling the conductive material in the longitudinal via openings and annular trench, and performing an etch-back or a chemical-mechanical polishing (CMP) process to remove the conductive material on the dielectric layer 18.

During the back end process, wires 24 and a protection ring 26 are respectively formed on the dielectric layer 18 above the logic circuit region 12 and the MEMS region 14. The wires 24 are electrically connected to the vias 20. The protection ring 26 is disposed on the protection plug 22 and connected thereto. The wires 24 and the protection ring 26 are formed by, for example, forming a conductive layer on the dielectric layer 18, and performing a lithography and an etching process to pattern the conductive layer.

Likewise, a dielectric layer 28 is formed on the substrate 10. Then, vias 30 and a protection plug 32 are respectively formed in the dielectric layer 28 on the logic circuit region 12 and the MEMS region 14. Wires 34 and a protection ring 36 are respectively formed on the dielectric layer 28 above the logic circuit region 12 and the MEMS region 14. The wires 34 are electrically connected to the vias 30. The protection ring 36 is electrically connected to the protection plug 32.

Figure 1B:
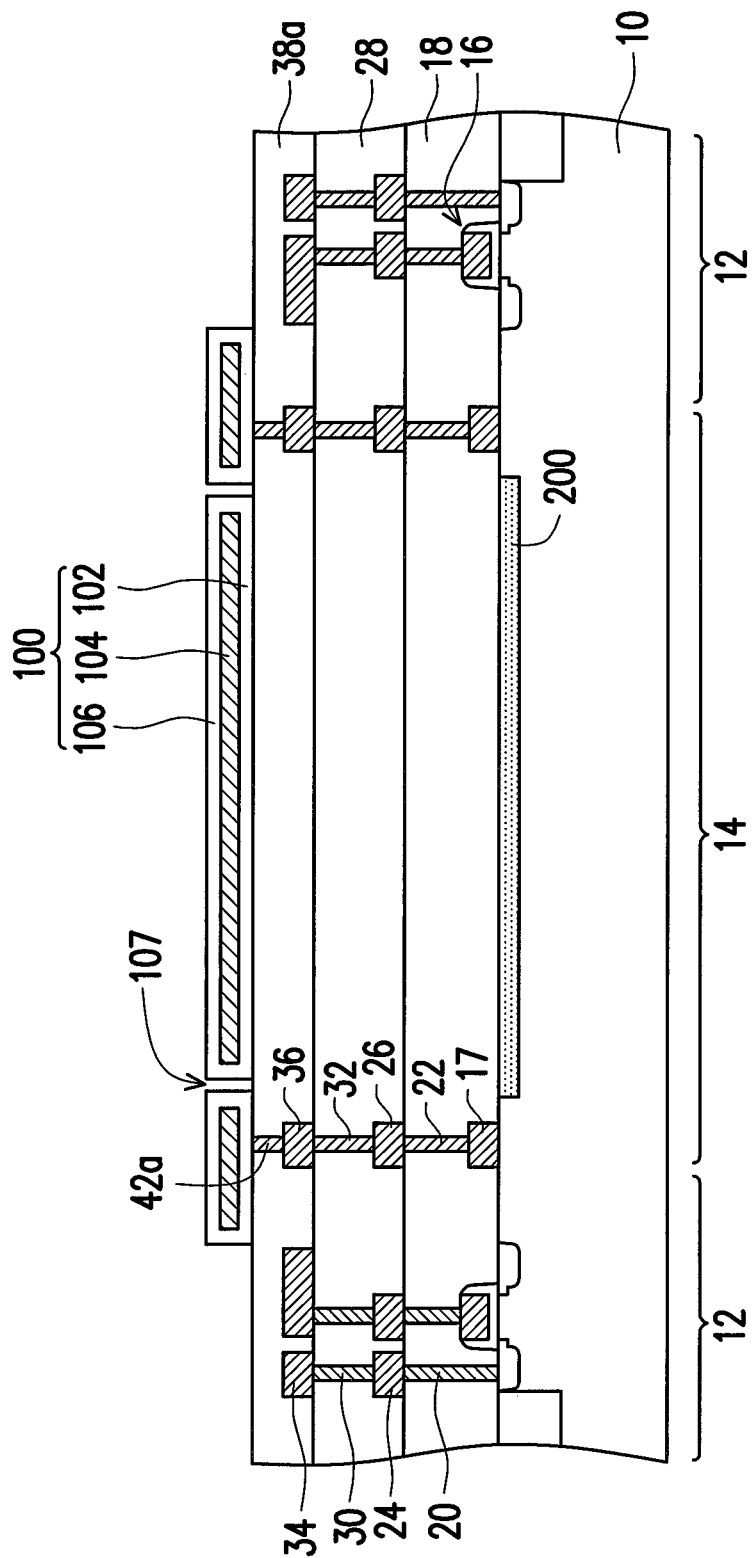
Figure 1C:
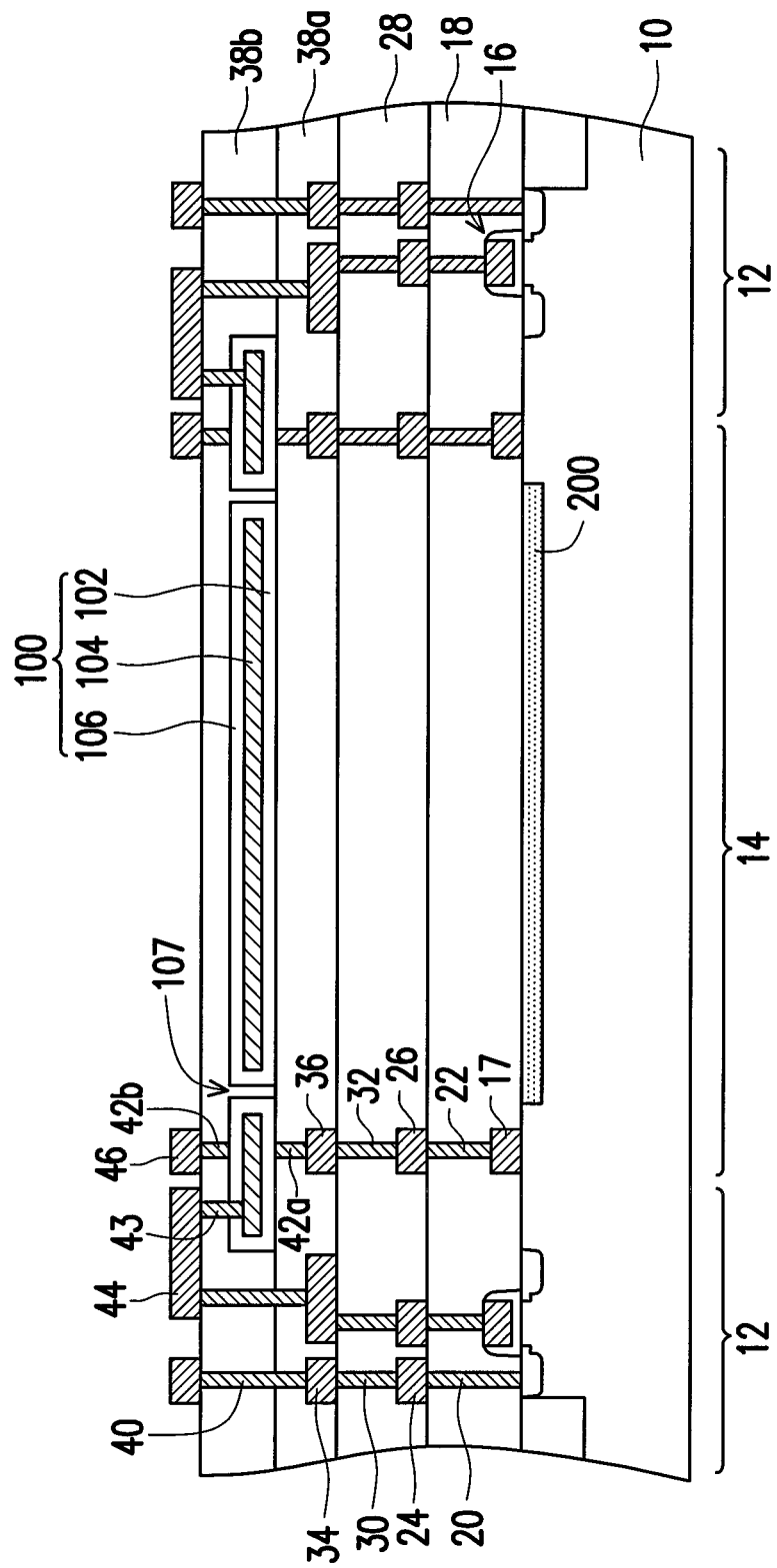

Afterward, referring to FIG. 1B, during the back end process, a dielectric layer 38a is formed on the substrate 10. In an embodiment, the dielectric layer 38a is flattened by using a CMP process. Then, a protection plug 42a is formed in the dielectric layer 38a on the MEMS region 14. A sandwich membrane 100 of the MEMS device is formed on the dielectric layer 38a above the MEMS region 14. The MEMS device is, for example, a MEMS microphone. The sandwich membrane 100 serves as another electrode of the MEMS device, and includes an insulating layer 102, an insulating layer 106, and a conductive layer 104 wrapped by the insulating layer 102 and the insulating layer 106, thus forming a sandwich structure. The insulating layers 102 and 106 may balance stress from the upper and lower sides. For instance, the sandwich membrane 100 is formed in the following method. A first insulating material layer is formed on the dielectric layer 38a, a conductive material layer is formed on the first insulating material layer, and a lithography and an etching process are performed to pattern the conductive material layer to obtain a patterned conductive layer 104. Then, a second insulating material layer is formed on the conductive layer 104, and a lithography and etching process is performed to pattern the second insulating material layer and the first insulating material layer to obtain a patterned insulating layer 106 and a patterned insulating layer 102. The patterned insulating layer 106 and insulating layer 102 are formed with through-holes 107 to expose the dielectric layer 38a.

Likewise, a dielectric layer 38b is formed on the substrate 10. Vias 40 are formed in the dielectric layers 38a and 38b on the logic circuit region 12, and electrically connected to the wires 34. A protection plug 42b and vias 43 are formed surrounding the MEMS region 14. The protection plug 42b is disposed on the sandwich membrane 100 and connected thereto. The vias 43 is electrically connected to the conductive layer 104 of the sandwich membrane 100. Wires 44 and a protection ring 46 are respectively formed on the dielectric layer 38b above the logic circuit region 12 and the MEMS region 14. The wires 44 are electrically connected to the vias 40 and 43. The protection ring 46 is connected to the protection plug 42b.

Figure 1D:
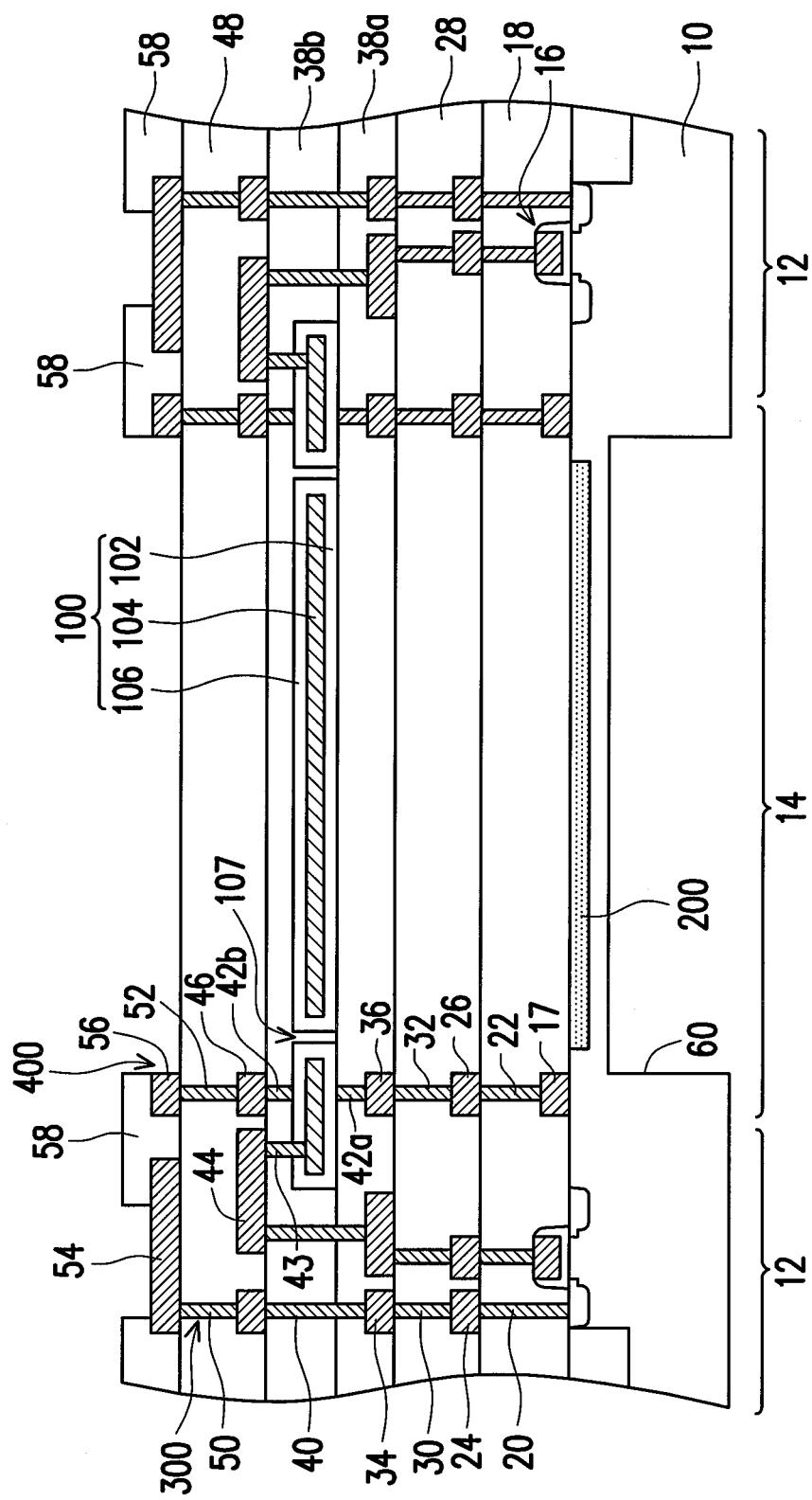
Figure 1E:
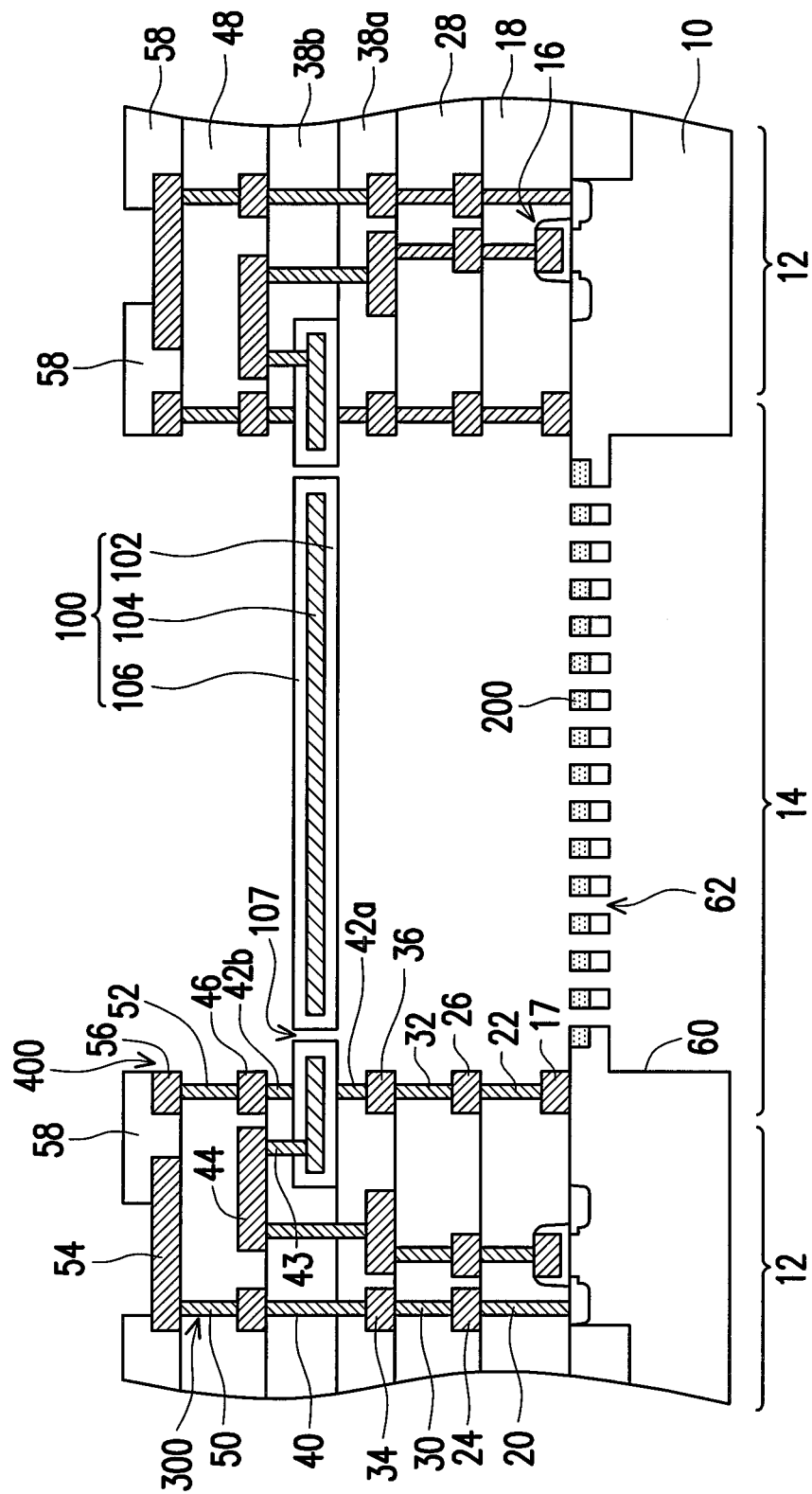

Next, referring to FIG. 1D, during the back end process, a dielectric layer 48 is formed on the substrate 10. Vias 50 are formed in the dielectric layer 48 on the logic circuit region 12, and electrically connected to the wires 44. A protection plug 52 is formed surrounding the MEMS region 14. The protection plug 52 is connected to the protection ring 46. Bonding pads 54 and a protection ring 56 are respectively formed on the dielectric layer 48 above the logic circuit region 12 and the MEMS region 14. The bonding pads 54 are electrically connected to the vias 50. The protection ring 56 is connected to the protection plug 52.

The wires 24, 34, 44 are laterally extended, and the vias 20, 30, 40, 43, 50 are longitudinally extended, so as to form a metal interconnect 300. The wires 24, 34, 44 may be made of the same or different materials, for example, metal like aluminum, tungsten, or any alloy thereof. The vias 20, 30, 40, 43, 50 may be made of the same or different materials, for example, metal like aluminum, copper, tungsten, titanium, tantalum, combination thereof, nitride thereof or any alloy thereof.

The protection rings 17, 26, 36, 46, 56 and the protection plugs 22, 32, 42a, 42b, 52 all surround the MEMS region 14, and are staked on each other to form a protection wall 400, so as to separate the dielectric layers 18, 28, 38a, 38b, 48, 48 on the logic circuit region 12 and the MEMS region 14. The protection rings 17, 26, 36, 46 and the protection plugs 22, 32, 42a, 42b, 52 may be made of the same or different materials, for example, a doped poly-silicon, metal silicide, or metal like aluminum, tungsten, or any alloy thereof. In an embodiment, a material of the protection ring 17 is the same as that of a gate of the MOS device 16, for example, a doped poly-silicon or metal silicide. A material of the protection plugs 22, 32, 42a, 42b, 52 is the same as that of the vias 20, 30, 40, 43, 50, for example, metal like aluminum, copper, tungsten, titanium, tantalum, combination thereof, nitride thereof or any alloy thereof. A material of the protection rings 26, 36, 46 is the same as that of the wires 24, 34, 44, for example, metal like aluminum, tungsten, or alloy thereof.

The dielectric layers 18, 28, 38a, 38b, 48 can be a single layer or a composite layer consisted of a plurality of different materials. The dielectric layers 18, 28, 38a, 38b, 48 may be made of the same or different materials, for example, silicon oxide or any material having a dielectric constant lower than 4, and formed by chemical vapor deposition (CVD), spin-on coating or other suitable methods.

In the MEMS device, the insulating layers 102 and 106 in the sandwich membrane (or electrode) 100 may be made of the same or different materials, such as silicon nitride or silicon oxynitride, which differs from the material of the dielectric layers 18, 28, 38a, 38b, 48. The insulating layers 102 and 106 are formed by CVD or other suitable methods. The conductive layer 104 may be made of metal like aluminum, tungsten, titanium, or tantalum, and formed by physical vapor deposition (PVD), CVD, or other suitable methods. In an embodiment, the insulating layers 102 and 106 are respectively silicon nitride with a thickness of tens of angstroms to hundreds of angstroms, and a thickness of the conductive layer 104 is about hundreds of angstroms.

Afterward, a protection layer 58 is formed on the dielectric layer 48 above the logic circuit region 12 and the MEMS region 14. The protection layer 58 is covered on the bonding pad 54 and the protection ring 56. Then, a part of the substrate 10 on the MEMS region 14 is removed to form an air cavity 60.

Finally, referring to FIG. 1D, a part of the substrate 10 on the MEMS region 14 and a part of the substrate 10 having the doped region 200 are removed to form a plurality of openings 62, so as to expose the dielectric layer 18. Then, using an etchant, for example, a vapor etching gas or a wet etchant, the dielectric layer 18 exposed by the openings 62 and the dielectric layers 28, 38a located above the dielectric layer 18 are removed, and the dielectric layers 38b, 48 are removed via the through-holes 107 in the insulating layers 102, 106.

In the subsequent process, the substrate is die-cut and then packaged, or die-cut after wafer level packaging, which is known to persons skilled in the art and may not be described herein again.

In the above embodiments, the electrode 200 is a doped region in the substrate 10 for ease of illustration, but the present invention is not limited thereto. The electrode 200 can also be a metal layer or an additional metal layer in the back end process. The electrode 200 may also be disposed between the sandwich membrane 100 and the substrate 10, or above the sandwich membrane 100. The electrode 200 can be made of metal, a doped poly-silicon, or other conductive materials.

Further, in the drawings, the sandwich membrane 100 has two through-holes 107 for illustration, but the present invention is not limited thereto. The sandwich membrane 100 can includes a plurality of through-holes 107 therein so that the sandwich membrane 100 has a meshed shape.

In addition, a typical method of fabricating a metal interconnect is taken above as an example for illustration, but the present invention is not limited thereto. The metal interconnect may also be formed by a dual damascene process and the vias (plugs), the wires and the protection rings can be made of copper. In the process, a dielectric layer is formed, dual damascene openings including trenches and via holes are then formed in the dielectric layer, and a conductive material is filled in the trenches and the via holes.

In the process of fabricating an IC according to the present invention, the fabrication of the MEMS device is integrated with that of the semiconductor device, for example, a CMOS. Particularly, after the semiconductor device is formed on the substrate, the fabrication of the sandwich membrane of the MEMS device is integrated with the back end process of forming the metal interconnect during the fabrication of the semiconductor device. That is, the dielectric layer between two neighboring levels of wires is formed in segments, and the sandwich membrane of the MEMS device is formed during the fabrication of the dielectric layer, so that the sandwich membrane is buried in the dielectric layer. Thereby, the process of fabricating an IC is simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated circuit (IC), comprising:
    a substrate including a logic circuit region and a microelectromechanical system (MEMS) region;
    a metal-oxide semiconductor (MOS) device, located on the logic circuit region of the substrate;
    a protection wall surrounding the MEMS region;
    a metal interconnect, formed by a plurality of levels of wires and a plurality of vias, and located above the logic circuit region of the substrate to connect the MOS device; and
    a MEMS device, located on the MEMS region, and comprising a sandwich membrane serving as an electrode located between any two neighboring levels of wires in the metal interconnect and connected to the metal interconnect.

2. The IC according to claim 1, wherein the sandwich membrane comprises a first insulating layer, a second insulating layer, and a conductive layer located between the first insulating layer and the second insulating layer.

3. The IC according to claim 2, wherein a material of the first insulating layer and the second insulating layer is different from that of a dielectric layer in the metal interconnect.

4. The IC according to claim 2, wherein the material of the first insulating layer and the second insulating layer comprises silicon nitride or silicon oxynitride.

5. The IC according to claim 1, further comprising another electrode located in the substrate.

6. An integrated circuit (IC), comprising:
   a substrate including a logic circuit region and a microelectromechanical system (MEMS) region;
   a metal-oxide semiconductor (MOS) device, located on the logic circuit region of the substrate;
   a metal interconnect, formed by a plurality of levels of wires and a plurality of vias, and located above the substrate to connect the MOS device; and
   a MEMS device, located on the MEMS region, and comprising a sandwich membrane serving as an electrode located between any two neighboring levels of wires in the metal interconnect and connected to the metal interconnect;
   wherein the sandwich membrane comprises a first insulating layer, a second insulating layer, and a conductive layer located between the first insulating layer and the second insulating layer, the metal interconnect is electrically connected to the conductive layer of the sandwich membrane.

7. The IC according to claim 1, wherein the protection wall completely surrounds the MEMS region.

8. The IC according to claim 1, wherein the protection wall is spatially separated from the metal interconnect and is insulated from the metal interconnect and the MEMS device.

* * * * *